ically, US009905300B2

(12) United States Patent
Kitagawa et al.

(10) Patent No.: US 9,905,300 B2
(45) Date of Patent: Feb. 27, 2018

(54) MEMORY DEVICE WITH VARIABLE TRIM PARAMETERS

(71) Applicant: Sony Semiconductor Solutions Corporation, Kanagawa (JP)

(72) Inventors: Makoto Kitagawa, Folsom, CA (US); Takafumi Kunihiro, Boise, ID (US); Wataru Otsuka, Boise, ID (US); Tomohito Tsushima, Boise, ID (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/417,527

(22) Filed: Jan. 27, 2017

(65) Prior Publication Data

US 2017/0140827 A1    May 18, 2017

Related U.S. Application Data

(63) Continuation of application No. 14/181,054, filed on Feb. 14, 2014, now Pat. No. 9,594,516.

(51) Int. Cl.

| G11C 17/00 | (2006.01) |
|---|---|
| G11C 16/14 | (2006.01) |
| G11C 16/26 | (2006.01) |
| G11C 17/16 | (2006.01) |
| G11C 29/12 | (2006.01) |

(52) U.S. Cl.
CPC .............. *G11C 16/14* (2013.01); *G11C 16/26* (2013.01); *G11C 17/16* (2013.01); *G11C 29/12* (2013.01)

(58) Field of Classification Search
CPC ...................................... G11C 17/16

USPC ............................................................ 365/96
See application file for complete search history.

(56) References Cited

U.S. PATENT DOCUMENTS

| 8,737,141 B2 * | 5/2014 | Melik- |
| | | Martirosian ......... G11C 16/349 |
| | | 365/189.011 |
| 2009/0161415 A1 * | 6/2009 | Philipp .............. G11C 13/0004 |
| | | 365/148 |
| 2012/0163066 A1 * | 6/2012 | Maejima .................. G11C 8/08 |
| | | 365/148 |
| 2012/0243321 A1 | 9/2012 | Shinagawa |
| 2013/0250654 A1 * | 9/2013 | Sugimae ............ G11C 13/0002 |
| | | 365/148 |
| 2013/0265815 A1 | 10/2013 | Kim et al. |
| 2014/0078840 A1 * | 3/2014 | Seo ....................... G11C 29/022 |
| | | 365/194 |

(Continued)

FOREIGN PATENT DOCUMENTS

| CN | 102890963 | 1/2013 |
| KR | 10-1995-0010074 | 4/1995 |
| KR | 10-2011-0090624 | 8/2011 |

OTHER PUBLICATIONS

Official Action (with English translation) for Korean Patent Application No. 10-2014-0167192 dated Jan. 31, 2017, 7 pages.

(Continued)

*Primary Examiner* — Hoai V Ho
(74) *Attorney, Agent, or Firm* — Sheridan Ross P.C.

(57) ABSTRACT

A memory device comprising a memory array comprising a plurality of memory cells, two or more fuses coupled to the memory array, wherein each of the two or more fuses contains trim data for the memory array and a mode register for selecting one of the two or more fuses to be enabled.

20 Claims, 3 Drawing Sheets

(56) References Cited

U.S. PATENT DOCUMENTS

2014/0254261 A1* 9/2014 Yamano ................ G11C 16/26
 365/185.2
2015/0012794 A1* 1/2015 Losh ................... G06F 11/1008
 714/755

OTHER PUBLICATIONS

Official Action (with English Translation) for Chinese Patent Application No. 201510065492.7 dated Dec. 17, 2017, 20 pages.

* cited by examiner

MEMORY DEVICE WITH VARIABLE TRIM PARAMETERS

CROSS REFERENCE TO RELATED APPLICATIONS

This application is a continuation of U.S. patent application Ser. No. 14/181,054, filed Feb. 14, 2014, the disclosure of which is incorporated herein by reference in its entirety.

FIELD

Certain embodiments of the disclosure relate to non-volatile memory such as a flash memory device. More specifically, embodiments of the disclosure relate to a memory device with variable trim parameters.

BACKGROUND

Memory devices tend to be used in a variety of contexts as technology advances. For instance, some usages may require that a memory device retain data for a long period of time, e.g., a hard disk storage device. Another usage may not necessarily be concerned with memory retention, but may require limited power consumption. For example, mobile devices often require low power memory due to limited battery capacity. Other contexts may require high reliability, low bit-error rate, high throughput, or the like, from a memory device. For various reasons, commercial and non-commercial users may have different expectations of endurance, reliability and the like, while produces of the memory device would prefer to limit the amount of devices produced specialized purposes. One type of memory device commonly used is a non-volatile memory known as flash memory. A flash memory is a type of EEPROM (electrically-erasable programmable read-only memory) that can be erased and reprogrammed in blocks.

Many modern personal computers (PCs) have their BIOS stored on a flash memory chip so that it can easily be updated if necessary. Such a BIOS is sometimes called a flash BIOS. In other instances, hard disks contain buffer memory which may be stored on a flash memory chip. Flash memory is also popular in portable electronic devices because it enables the manufacturer to support new communication protocols as they become standardized and to provide the ability to remotely upgrade the device for enhanced features. NOR and NAND flash memory devices are two common types of flash memory devices, so called for the logical form of the basic memory cell configuration in which each is arrange. Memory devices usually include trim circuits that are programmed to output parameter values used to provide a variety of options for algorithms that control the operations of the memory device. Such parameters may include timing, pulse counts, applied voltage levels, etc. The trim parameters are usually programmed once for a memory device and are rarely changed once the memory device has reached production.

However, when memory devices reach production, producers would like to use a single set of trim parameters for the memory device. Accordingly, if a customer requires, for example, high throughput, from the memory chip, and the memory chip is configured with trim parameters aimed at long endurance, the customer would have to request a new production of memory devices with long endurance trim parameters. This results in wasted time, money and effort on both the production and the customer side. Similarly, when a customer uses a memory device, it is difficult to know the correct trim parameters to use for long endurance to minimize error rate.

Therefore, there is a need in the art for a method and apparatus for a memory device with variable trim parameters and for autotuning the trim parameters.

SUMMARY

A memory device with variable trim settings is provided herein, as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

According to exemplary embodiments of the present invention, a memory device with variable trim settings is provided. In some embodiments, a user or customer (used interchangeably) may desire a memory device to behave in a particular way. For example, a user may require the memory device to last a predetermined number of read/write cycles, or the user may require the memory device to have a predetermined high throughput. In other instances, a user may require the memory device to consume a predetermined minimum amount of power, or the like. The user selects the particular mode they would like to use by applying a value to a mode register on the memory device. Each mode is associated with a fuse area which stores optimized trim parameters for the associated mode. Once the memory device is in operation, the mode register determines which fuse area the operating parameters are selected and loaded from.

Figure 1:
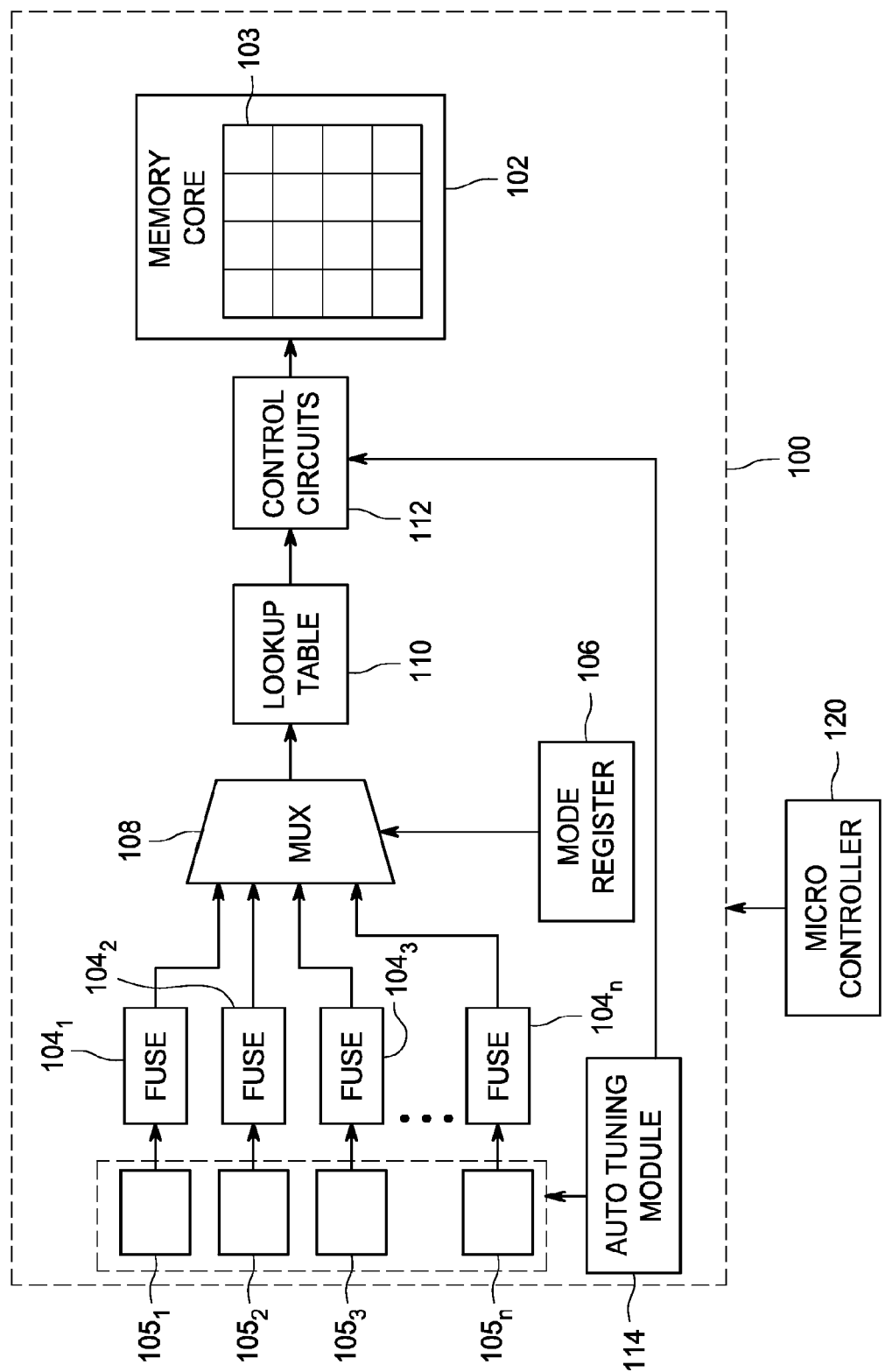
FIG. 1 is a block diagram depicting a memory device with variable trim settings in accordance with exemplary embodiments of the present invention.

FIG. 1 is a block diagram depicting a memory device 100 with variable trim settings in accordance with exemplary embodiments of the present invention. The memory device 100 comprises a memory core 102, a plurality of fuses $104_1$ to $104_n$, corresponding fuse areas $105_1$ to $105_n$, a mode register 106, a multiplexer 108, control circuits 112 and an autotuning module 114.

The memory core 102 comprises a memory array 103 with plurality of memory tiles/pages, each tile comprising a plurality of memory cells (not shown). The memory core 102 may incorporate elements known to those of ordinary skill in the art such as a row/column decoder, a sense amplifier for reading bits from the memory cells and the like. Generally, the memory core 102 is controlled by the control circuits 112. The control circuits 112 may comprise one or more regulators for regulating current, pulse controllers for controlling a pulse applied to the memory core 102 or the like.

Operations on the memory core 102 entail applying a pulse via the control circuits 112 to control various circuits within the memory core 102 at particular voltage and current levels for different modes (i.e., different usage scenarios). Generally, a SET operation on a memory cell in the memory core 102 causes the cell to go from a high state to a low state. In resistive RAM (ReRAM), the SET operation causes a memory cell to go from a high resistive state (HRS) to a low resistive state (LRS), while a RESET operation causes the memory cell to go from a LRS to an HRS.

A user of the memory device 100, such as a customer, end-user, or a manufacturer incorporating use of the memory device into anther device can select a mode for the memory device 100 using the mode register 106. Each mode that the memory device 100 is configured for is stored in fuse areas $105_1$ to $105n$ (collectively fuse areas 105), each coupled to corresponding fuses $104_1$ to $104_n$ (collectively, fuses 104) depending on how many modes there are. The fuse areas 105 store optimized parameters for their corresponding mode. A user selects a particular mode by setting the mode register 106 to a value. The value is a predetermined value which corresponds to a particular mode. For example, setting the mode register 106 to "1" may, in one embodiment, indicate that the user desires Mode 1 to be selected. In this embodiment, Mode 1 has optimized parameters stored in fuse area $105_1$, coupled to fuse $104_1$. Those of ordinary skill in the art will recognize that the present invention does not limit the fuse from being any non-volatile memory which stores information to be loaded to SRAM or registers at power-up of the memory device 100. In some embodiments, the fuse device may be a traditional gate oxide anti-fuse or can be similar to a memory cell in the array of memory device 100.

During subsequent operation of the memory device, the multiplexer 108 reads the mode register 106 and selects the input from fuse $104_1$ as an output. The resultant output from the multiplexer 108 is loaded into a lookup table 110, corresponding to the selected mode. The lookup table 110 comprises many different operational parameters for the memory core 102. In some embodiments, the lookup table 110 stores at least VSET, VRESET, ISET, IRESET, PSET, and PRESET. Other operational parameters may be included as well. VSET and ISET are, respectively, the voltage and current used for a SET pulse to be applied to a memory cell in the memory core 102. PSET is the pulse width required for the SET operation on a memory cell. VRESET, IRESET and PRESET are, respectively, the voltage, current and pulse width for the RESET pulse applied to a memory cell in the memory core 102. Other parameters often stored in the lookup table 110 include at least the number of set bits, the number of verifies and VREAD. The number of set bits is the number of bits that are set simultaneously. The number of verifies corresponds to the number of pulses applied to the memory core 102 for setting or resetting memory cells. VREAD corresponds to the voltage used for reading the current value of a memory cell in the memory core 102. During operation of the memory device 100, the memory core 102 determines operational parameters based on what is loaded in the lookup table 110.

TABLE 1

| Mode Register | Vset | Iset | Ireset | Vreset | Pset | Preset | # of set bit | # of verify | Vread |
|---|---|---|---|---|---|---|---|---|---|
| Mode 1 "High Throughput" | 5.0 V | 35 uA | 35 uA | 2.5 V | 300 ns | 300 ns | 128 | 1 | 0.3 V |
| Mode 2 "Long Endurance" | 5.0 V | 35 uA | 35 uA | 2.8 V | 300 ns | 1 us | 128 | 2 | 0.2 V |

Examples of parameter sets for modes may range from high performance, high reliability, long endurance, or the like. Table 1 shows one example of a plurality of modes. Specifically, mode 1 shows a parameter set for high throughput of the memory device 100 and mode 2 shows a parameter set for long-endurance of the memory device 100. High throughput mode tends to damage the cell more quickly than long endurance mode because of the high Vread voltage associated with high throughput mode. This particularly applies if the memory device 100 is a ReRAM device, and a memory cell to be read is in a low resistance state.

In Mode 1, the pulse width is 300 ns, shorter than the 1 us pulse width in mode 2 also contributing to high throughput, because the pulse with of the SET and RESET pulse operations are shorter, so more SET and RESET operations can be performed during a period of time. Another parameter to note is that the number of verifies is less in Mode 1 than in Mode 2. The number of verifies indicates how many pulses are to be applied to a memory cell. Applying a larger number of pulses to the cell for each operation negatively impacts performance, thus mode 1 only applies one pulse, while mode 2 applies two pulses.

TABLE 2

| Mode Register | Vset | Iset | Ireset | Vreset | Pset | Preset | # of set bit | # of verify | Vread |
|---|---|---|---|---|---|---|---|---|---|
| Mode 1 "Low Power" | 4.0 V | 35 uA | 35 uA | 2.5 V | 300 ns | 300 ns | 256 | 1 | 0.2 V |
| Mode 2 "Low BER" | 5.0 V | 35 uA | 35 uA | 2.5 V | 300 ns | 300 ns | 128 | 4 | 0.2 V |

Table 2 shows another example of "mode 1", which allows for low power consumption than "mode 2", which allows for a low bit error rate (BER). In this example, the low power "mode 1" applies the SET pulse a larger numbers of bits (265) in parallel than the low BER mode 2 (128 bits).

In general, resistive ram devices tend to have a plate node such as a common source line (CSL) which is shared by cells in a particular tile of the memory core 102. Because of the higher capacitance of the CSL node, to minimize power consumption it is preferable to alter the state of the CSL once for a larger number of bits. For example, if the lookup table 110 contains the parameter set associated with "mode 1" shown in Table 2, the number of set bits is equal to 256. Accordingly, while mode 1 is set via the mode register 106, the CSL for the memory core 102 is set to HIGH and LOW for every 256 bits, as opposed to mode 2, where the CSL is set to HIGH and LOW every 128 bits. Accordingly, mode 1 consumes significantly less power than mode 2.

TABLE 3

| Mode Register | Vset | Iset | Ireset | Vreset | Pset | Preset | # of set bit | # of verify | Vread |
|---|---|---|---|---|---|---|---|---|---|
| Mode 1 "Long Retention" | 5.0 V | 40 uA | 40 uA | 2.5 V | 1 us | 300 ns | 128 | 1 | 0.15 V |
| Mode 2 "Low Power" | 5.0 V | 35 uA | 35 uA | 2.5 V | 300 ns | 300 ns | 128 | 1 | 0.2 V |

Table 3 shows another example of "mode 1", which allows for longer retention of data in the memory cells of memory core 102 as compared to "mode 2", which allows the memory device 100 to consume less power. In this example, "mode 1" has a higher set (Iset) and reset (Ireset) currents than mode 2, allowing for longer bit retention in the memory cells. However, this consumes more power. Further, the pulse width (Pset) is increased, also consuming more power than the 300 ns pulse width of mode 2.

Those of ordinary skill in the art will recognize that tables 1-3 are merely examples of possible parameter sets for various modes for a memory core 102. Other combinations of the shown parameters may be stored in fuse areas 105 and additional parameters may also be incorporated for operation of the memory device 100. A memory device 100 may include all of the modes shown in tables 1-3 behind individual fuses, or may only incorporate two modes, depending on customer requirements. Accordingly, exemplary embodiments of the present invention provide pre-trimmed parameter groups (trim parameters) allowing a customer to choose favorable parameters based on their usage.

The autotuning module 114 is employed to automatically select an optimized parameter set from a plurality of pre-defined parameter sets. According to an exemplary embodiment, prior to storing a parameter set in each fuse area 105, the autotuning module 114 is applied to a set of parameters for each usage scenario. For each scenario, an optimized parameter set is chosen and stored in the fuse areas $105_1$ to $105_g$.

The autotuning module 114 iterates through a plurality of given or predefined, trim parameter sets. The autotuning module 114, in some instances, is invoked by a user, e.g., a customer embedding the memory device 100 in another device, via a microcontroller 120, external to the memory device 100. Each predefined parameter set is stored on memory of the memory device 102. For example, the parameters may be stored in the memory core 102, or in a dedicated memory area for testing. The microcontroller 120 examples all combinations of the parameters to produce the bit error rate, i.e., the number of failures that occur. Generally, memory cells contain a failure bit. If after a predetermined number of verify pulses are applied to a memory cell, and the failure bit is still set, then the microcontroller 120 determines that the particular page (tile) has failed because one or more memory cells on the page have failed to be set or reset.

The autotuning module 114 performs SET and RESET operations on the memory core 102 to determine which parameter sets have the least number of failures, where failures are determined as described above. The parameter set with the least number of failures for each usage scenario is stored in each of the fuse areas 105 as optimized trim parameters. According to other embodiments, the optimized trim parameters may be stored in a register read by the control circuits 112, or stored directly in the lookup table 110.

TABLE 4

|  | Iset | Ireset | Vreset | Number of fails (Output) |
|---|---|---|---|---|
| Parameter_set[0] | 35 uA | 35 uA | 2.0 V | 4 |
| Parameter_set[1] | 35 uA | 35 uA | 2.5 V | 2 |
| Parameter_set[2] | 35 uA | 40 uA | 2.0 V | 5 |
| Parameter_set[3] | 35 uA | 40 uA | 2.5 V | 6 |
| Parameter_set[4] | 30 uA | 35 uA | 2.0 V | 10 |
| Parameter_set[5] | 30 uA | 35 uA | 2.5 V | 12 |
| Parameter_set[6] | 30 uA | 40 uA | 2.0 V | 10 |
| Parameter_set[7] | 30 uA | 40 uA | 2.5 V | 8 |

Table 4 shows an example of a plurality of parameter 0-7 sets and the number of fails for each set. The autotuning module 114 selects paramater_set[1] because the number of fails is 2, less than all other parameter sets. Accordingly, paramater_set[1] will be stored in the lookup table 110, another specialized register, or in one of the fuse areas 105, overwriting any previously stored trim parameters.

Figure 2:
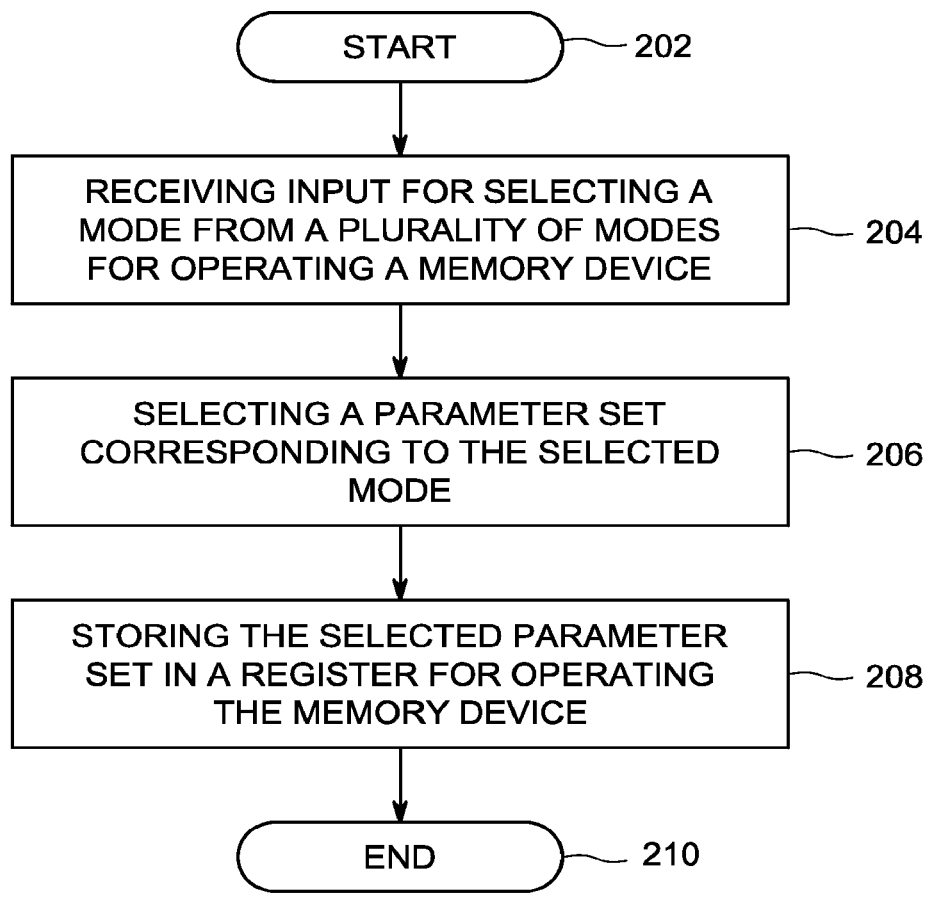
FIG. 2 is a flow diagram for a method for selecting a parameter set for a memory device with variable trim settings in accordance with exemplary embodiments of the present invention.

FIG. 2 is a flow diagram for a method 200 for selecting a parameter set for a memory device with variable trim settings in accordance with exemplary embodiments of the present invention.

Method 200 begins at step 202 and proceeds to step 204. At step 204, an input is received from a user selecting a particular mode of use for memory device 100. A value corresponding to the input of the user selected mode is stored in mode register 106. At step 206, parameter set corresponding to the selected mode is selected to be loaded into the lookup table 110 by engaging a corresponding fuse. At step 208, the selected parameter set is then loaded into the lookup table 110. The memory device 100 then uses the loaded parameter set as operational trim parameters to read and write to the memory core 102. The method terminates at step 210.

Figure 3:
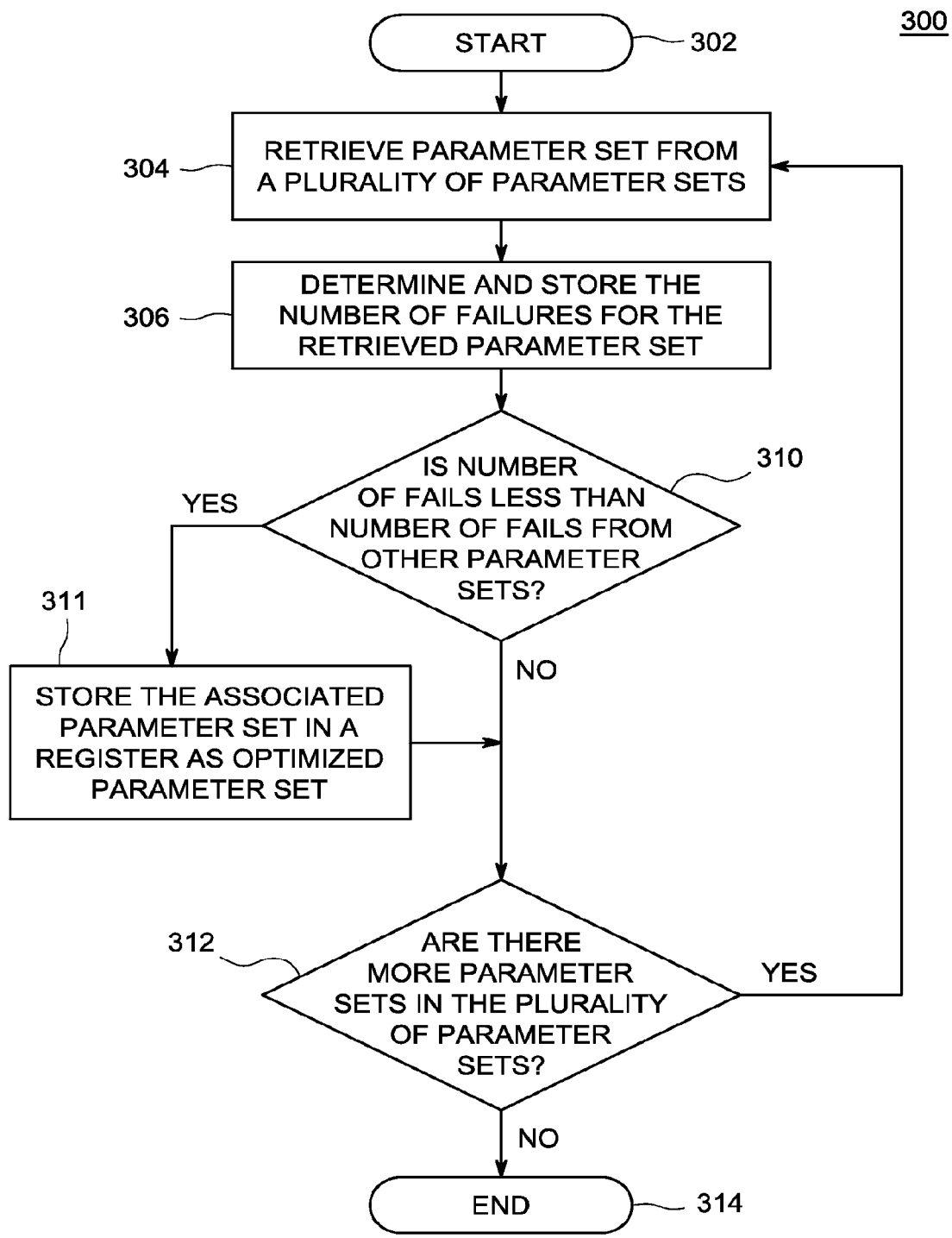
FIG. 3 is a flow diagram illustrating a method for automatically tuning trim parameters for a memory device in accordance with exemplary embodiments of the present invention.

FIG. 3 is a flow diagram illustrating a method 300 for automatically tuning trim parameters for a memory device in accordance with exemplary embodiments of the present invention.

Method 300 begins at step 302 and proceeds to step 304. At step 304, a parameter set is retrieved from a plurality of parameter sets by the autotuning module 114 of FIG. 1. The parameter sets are variations on parameters used by a memory device corresponding to particular usage scenarios such as low power consumption, increased throughput, reliability or the like. For example, the method 300 may be performed on several sets of parameter sets, one for each embodied usage scenario.

At step 306, a predetermined number of operation (e.g., SET and RESET) pulses are applied to the memory core 102, and the number of failures, as described with respect to FIG. 1, are determined and stored in either a dedicated testing area, or in the memory core 102. At step 310, the autotuning module 114 determines whether the number of fails is less than the number of fails stored from previous parameter sets. If the number of fails is not less than the number of failures than other stored parameter sets, the method proceeds to step 312 directly. If the number of failures is less than all other stored parameter sets, the associated parameter set is stored in a register as the optimized parameter set at step 311, and then the method proceeds to step 312.

At step 312, the autotuning module 114 determines whether there are any more parameter sets that have not been tested in the plurality of parameter sets. If there are more parameter sets to be tested for failure, the method proceeds to step 304 again. If there are no more parameter sets to be tested, then the parameter set currently stored in a register as the optimized parameter set is returned as the optimized parameter set and may be loaded into the lookup table 110, or stored in one of the fuse areas 105. The method terminates at step 314.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for automatically tuning trim parameters for a memory device comprising:
    iterating, using an autotuning module, over a plurality of predefined trim parameter sets;
    determining a number of failures for a memory page in the memory device when operating using each of the plurality of predefined trim parameter sets;
    determining which of the predefined trim parameter sets produces a least number of failures; and
    storing the predefined trim parameter set with the least number of failures as optimized trim parameters.

2. The method of claim 1, further comprising: performing iterating over several sets of predefined parameter sets, each of the several sets having values for each variable in a set of variables corresponding to a usage scenario of the memory device, wherein each of the several sets has at least one different value in the set of variables compared to the other of the several sets, and wherein iterating for all usage scenario returns a plurality of optimized trim parameters.

3. The method of claim 2, further comprising: storing the plurality of optimized trim parameters in each fuse area out of multiple fuse areas on the memory device.

4. The method of claim 1, further comprising: storing the optimized trim parameters in a lookup table on the memory device and overwriting a previous set of trim parameters.

5. The method of claim 1, wherein determining the number of failures for the memory page comprises: applying a predetermined number of operation pulses to the memory device; and determining the memory page has failed when a failure bit remains set after the predetermined number of operation pulses is applied.

6. The method of claim 5, further comprising: determining that the memory page has failed when one or more memory cells in the memory page has failed.

7. The method of claim 6, wherein the operation pulses comprise a SET pulse, RESET pulses, or a READ pulse.

8. The method of claim 7, wherein the predetermined number of operation pulses applied is determined according to a number of verifies of the memory device.

9. The method of claim 1, wherein each of the trim parameters sets comprise at least a set voltage, a set current, a reset voltage, a reset current, a set pulse width, a reset pulse width, a number of verify bits, a number of set bits and a read voltage.

10. The method of claim 1, further comprising: receiving user input at a microcontroller; and invoking the autotuning module based on the received user input.

11. A memory device, comprising:
    a memory array including a plurality of memory cells;
    two or more fuses coupled to the memory array, wherein each of the two or more fuses contains a plurality of trim parameter sets for the memory array; and
    an autotuning module configured to retrieve a trim parameter set from the plurality of trim parameter sets and to determine a number of failures for the retrieved trim parameter set.

12. The memory device of claim 11, wherein the plurality of trim parameters sets contain the same multiple operating parameters for the memory array, and wherein the multiple operating parameters comprise at least two different values between different trim parameter sets.

13. The memory device of claim 11, wherein the determining the number of failures is determining a number of failures for a memory page in the memory device, and wherein determining the number of failures comprises: applying a predetermined number of operation pulses to the memory device; and determining the memory page has failed when a failure bit remains set after the predetermined number of operation pulses is applied.

14. The memory device of claim 13, further comprising: determining that the memory page has failed when one or more memory cells in the memory page has failed.

15. The memory device of claim 13, wherein the operation pulses comprise a SET pulse, RESET pulses, or a READ pulse.

16. The memory device of claim 15, wherein the predetermined number of operation pulses applied is determined according to a number of verifies of the memory device.

17. The memory device of claim 11, wherein each of the plurality of trim parameters sets comprise at least a set voltage, a set current, a reset voltage, a reset current, a set pulse width, a reset pulse width, a number of verify bits, a number of set bits and a read voltage.

18. The memory device of claim 11, further comprising a microcontroller, wherein a user input is received at the microcontroller; and the autotuning module is invoked based on the received user input.

19. The memory device of claim 11, wherein the memory device is a NOR memory device.

20. The memory device of claim 11, wherein the memory device is a NAND memory device.

* * * * *